United States Patent
Hou et al.

(10) Patent No.: US 8,826,207 B2
(45) Date of Patent: Sep. 2, 2014

(54) METHOD OF GENERATING TECHNOLOGY FILE FOR INTEGRATED CIRCUIT DESIGN TOOLS

(75) Inventors: Cliff Hou, Taipei (TW); Gwan Sin Chang, Hsin-Chu (TW); Cheng-Hung Yeh, Jhunan (TW); Chih-Tsung Yao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1221 days.

(21) Appl. No.: 11/966,570

(22) Filed: Dec. 28, 2007

(65) Prior Publication Data
US 2009/0077507 A1    Mar. 19, 2009

Related U.S. Application Data

(60) Provisional application No. 60/973,064, filed on Sep. 17, 2007.

(51) Int. Cl.
*G06F 9/455* (2006.01)
*G06F 17/50* (2006.01)

(52) U.S. Cl.
CPC .................................. *G06F 17/5036* (2013.01)
USPC ............... 716/111; 716/51; 716/52; 716/106; 716/110; 716/115

(58) Field of Classification Search
CPC ............ G06F 17/5036; G06F 17/5081; G06F 17/5068; G06F 2217/10
USPC .......... 716/4, 5, 10, 51, 52, 54, 106, 110–115
See application file for complete search history.

(56) References Cited

U.S. PATENT DOCUMENTS

| | | | |
|---|---|---|---|
| 6,175,947 B1* | 1/2001 | Ponnapalli et al. | 716/5 |
| 6,185,722 B1* | 2/2001 | Darden et al. | 716/5 |
| 6,594,799 B1* | 7/2003 | Robertson et al. | 716/100 |
| 7,093,206 B2* | 8/2006 | Anand et al. | 716/1 |
| 7,103,524 B1* | 9/2006 | Teig et al. | 703/14 |
| 7,308,655 B2* | 12/2007 | Chu et al. | 716/1 |
| 7,398,509 B2* | 7/2008 | Schepp et al. | 716/19 |
| 7,587,691 B2* | 9/2009 | Sutjahjo et al. | 716/4 |
| 7,669,152 B1* | 2/2010 | Tcherniaev et al. | 716/136 |
| 2006/0053394 A1* | 3/2006 | Batterywala et al. | 716/5 |

OTHER PUBLICATIONS

"Precise Extraction of Ultra Deep Submicron Interconnect Parasitics with Parameterized 3d-Modeling", by M.R. Frerichs, IEEE, @2001.*

* cited by examiner

*Primary Examiner* — Nha Nguyen
(74) *Attorney, Agent, or Firm* — Slater and Matsil, L.L.P.

(57) ABSTRACT

A method and system for extracting the parasitic capacitance in an IC and generating a technology file for at least one or more IC design tools are provided. Parasitic extraction using the preferred method can significantly reduce field solver computational intensity and save technology file preparation cycle time. The network-based technology file generation system enables circuit designers to obtain a desired technology file in a timely manner. The common feature of the various embodiments includes identifying common conductive feature patterns for a given technology generation. Capacitance models created from the identified patterns are used to assemble the required technology files for IC design projects using different technology node and different process flows.

16 Claims, 7 Drawing Sheets

.FOX.OD.PO.M1.MX x 1
.OD.PO.M1.MX.MX x 1
.PO.M1.MX.MX.MX x 1
.M1.MX.MX.MX.MX x 1
.MX.MX.MX.MX.MX x 2
.MX.MX.MX.MX.MZ x 1
.MX.MX.MX.MZ.MZ x 1
.MX.MX.MZ.MZ.MR x 1

METHOD OF GENERATING TECHNOLOGY FILE FOR INTEGRATED CIRCUIT DESIGN TOOLS

This application claims the benefit of U.S. Provisional Application No. 60/973,064, filed on Sep. 17, 2007, entitled "RC Technology File Compiler," which application is hereby incorporated herein by reference.

TECHNICAL FIELD

The present invention relates generally to an integrated circuit design, and more particularly to generating technology files for computer-aided integrated circuit design tools.

BACKGROUND

During the course of designing an integrated circuit ("IC"), various analyses and optimization steps may be performed by IC designers to insure the designed IC meets the pre-determined specification and delivers the desired performance. These analysis steps are typically performed by various Electronic Design Automation ("EDA") tools, and may include parasitic resistance and capacitance extraction, circuit delay calculation, timing analysis, cross-coupling and signal integrity analysis, resistive voltage drop calculation, and power dissipation analysis. A designed IC is checked against a plurality of pre-determined criteria of the mentioned analyses. An optimization step typically follows when the designed IC fails one or more of the pre-determined criteria. A designed IC typically needs one or more analysis-optimization cycles before it meets all the pre-determined criteria and goes into production phase. In order to perform the desired analyses, a resistance-capacitance ("RC") technology file is first prepared and supplied to the various EDA tools.

Figure 1:
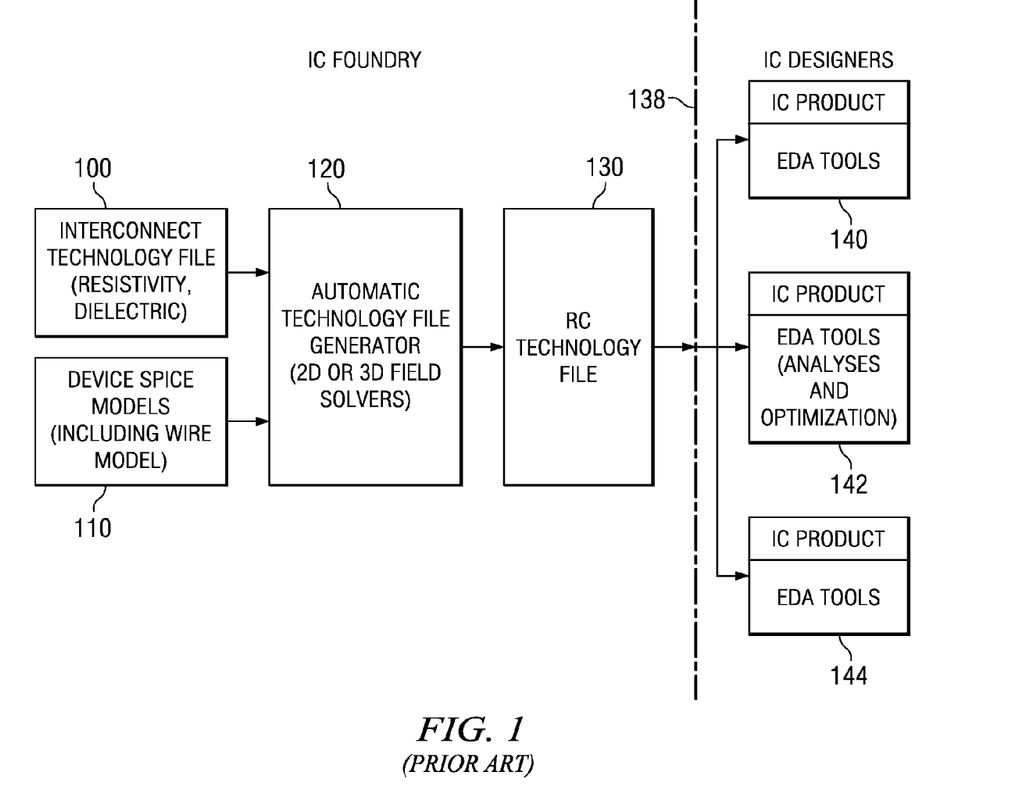
FIG. 1 shows a system diagram of a known RC technology file generation process.

FIG. 1 shows a system diagram of a known RC technology file generation process. Interconnect Technology File 100 is usually first prepared by a technology vendor (also generally known as a technology foundry or an IC foundry), where a designed IC is actually manufactured. An interconnect technology file typically includes fabrication process parameters of the various conductor layers in an IC, such as the minimum spacing and minimum width of the conductors as specified in the design rules for the conductor layers, the thickness of the conductor layers, the heights of the conductor layers above the semiconductor substrate, the resistivities of the conductor layers, the interlayer planer dielectric constant and its thickness, the name of the top conductor layer of a via, the bottom conductor layer of the via, the contact resistance of the via, the name of the wells, and so on.

In addition, a model file 110 may also be prepared. Typically, a SPICE model, a circuit level semiconductor device description program well known in the art, is used to model the various semiconductor circuits and interconnects in an IC, including wires coupling one circuit with another. A SPICE model file may provide desired information, such as dimensions of devices, width and thickness of diffusion layers in the substrate, and preferred wire models, such as distributed RC model, lumped resistance-inductance-capacitance (RLC) model, and distribute RLC model for calculating coupling effects between adjacent wires with desired precision.

Information from interconnect technology file 100 and SPICE model 110 is subsequently read in field solver 120. Field solver 120 is typically a specialized software program that solves Maxwell's equations. Using the information from interconnect technology file 100 and SPICE model 110, field solver 120 can automatically identify thousands or even tens of thousands of primitives of conductive features having various surrounding conditions (also usually referred to as environments), and then calculate the capacitances of all the primitives. Field solver 120 may launch different field solving approaches, 2-D (two-dimensional) or 3-D (three-dimensional) depending on the desired accuracy, to calculate the capacitances of all the primitives. This process is also generally known as "extracting" capacitances from the primitives.

The outcome of field solver 120 is RC technology file 130 (also known as RC tech file 130), wherein a capacitance table is typically presented. The capacitance table comprises capacitances "extracted" from the various primitives. It represents the capacitance characteristics of a given technology. The validity and accuracy of RC tech file 130 is then verified by the technology foundry through a quality assurance ("QA") process. RC tech file 130 is subsequently provided to the various EDA IC design tools of IC products 140, 142, and 144. Vertical dashed line 138 in FIG. 1 indicates the interface boundary between a technology foundry and IC designers. In extracting the capacitance from the circuit layout of a designed IC product, such as IC product 140, the circuit layout is first divided into small pieces wherein each small piece contains a recognized primitive polygon pattern in RC tech file 130. The extraction EDA tool, then, extracts parasitic capacitance of IC product 140 by reading a pre-calculated capacitance value of such a primitive polygon pattern stored in the capacitance table of RC tech file 130. The full-chip parasitic value of a designed IC is usually obtained by Boolean operations on the primitive geometric patterns.

Figure 2:
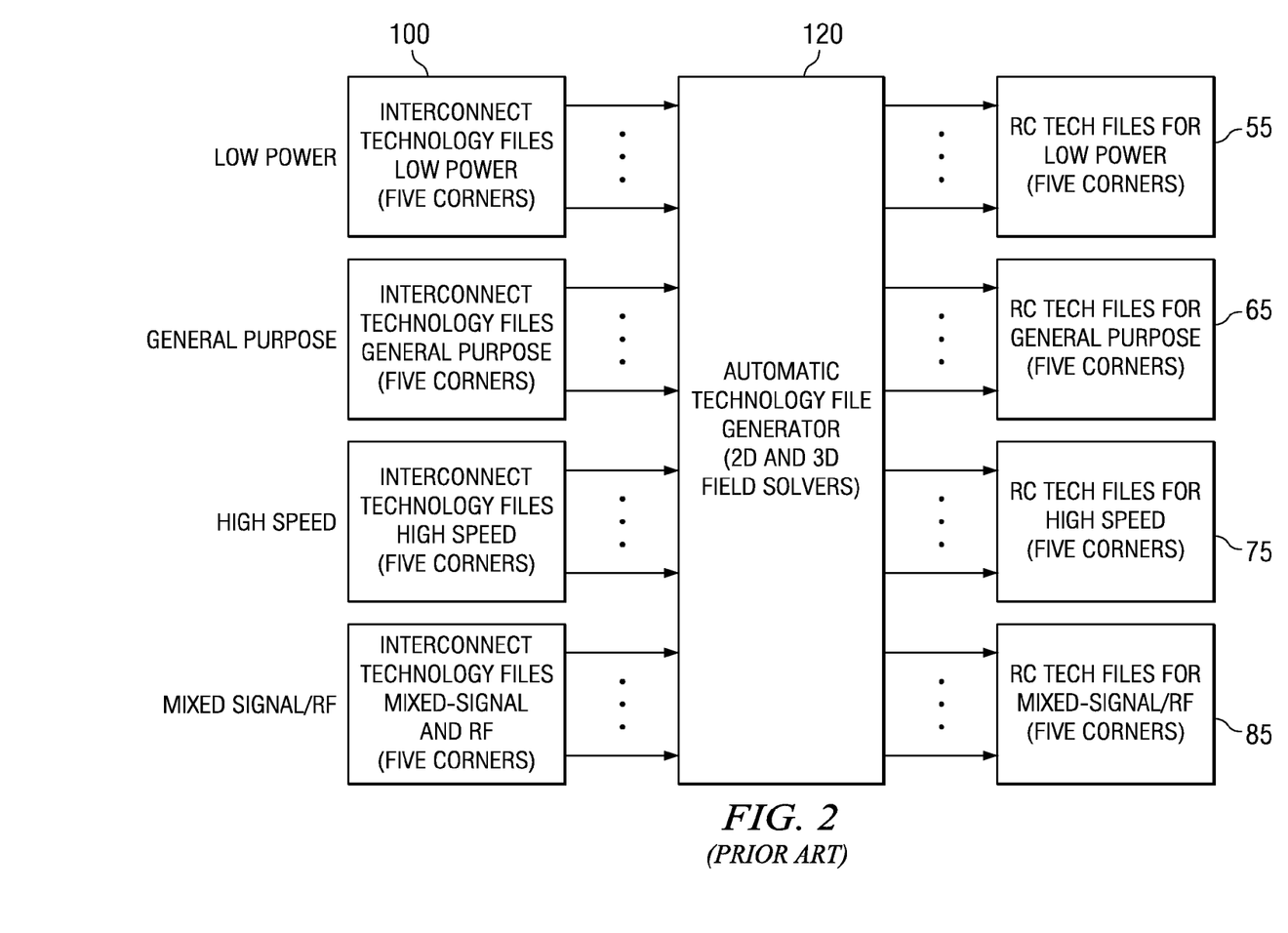
FIG. 2 illustrates the creation of RC technology files for a given technology generation by a known process.

FIG. 2 illustrates the creation of RC tech files for a given technology generation by a known process. Four groups of RC tech files 55, 65, 75, and 85 are separately created. Each group typically includes RC tech files tailored to provide optimal circuit performance on designed ICs used in a specific application field (also known as a technology node). As an example, RC tech files 55 are usually most suitable for designing ICs for lower power applications. RC tech files 65 are of the tailored for designing ICs for general purpose applications. RC tech files 75 are generally tailored for designing ICs where high circuit switching speed is desirable, and RC tech files 85 are most suitable for designing mixed signal and RF (radio-frequency) ICs.

For each technology node, a plurality of RC tech files is typically prepared, each enabling designing ICs fabricated by a pre-determined process flow. For instance, RC tech files 55 may comprise a first RC tech file that includes five interconnect layers, separated by inter-layer insulating material having a first dielectric constant. RC tech files 55 may also comprise a second RC tech file, which is more suitable for designing ICs having nine interconnect layers. Furthermore, multiple RC tech files characterizing the processing variation of a pre-determined process flow are usually generated to exam the collective effects of processing variation on the electrical characteristics of a designed IC. These RC tech files are known for covering different process corners of a process flow. In the example shown in FIG. 2, each process flow requires five RC tech files, covering five process corners. A first RC tech file may, for example, cover the worst process corner of fabricating NMOS transistor in an IC, the worst process corner of fabricating PMOS transistors in the IC, and the nominal process condition of fabricating wires in the IC (generally known as a worst-worst-nominal process corner). As an example of the impacts of the process variation on the circuit performance, a worst process corner of fabricating wires results in wires having a width and thickness narrower and thinner than the pre-determined specification, thus leading to larger-than-expected resistance and smaller-than-expected capacitance. Likewise, a best process corner of fabricating wires results in wires having width and thickness wider and thicker than the pre-determined specification, thus leading to smaller-than-expected resistance and larger-than-expected capacitance. With a similar token, a second RC tech file may cover a worst-best-best process corner. Typically, hundreds of RC tech files are needed for a given technology generation in order to enable designing ICs that are used in different application fields, fabricated through different process flows, and tested against different process corners. The number of the required RC tech files increases significantly for advanced technology generations.

Generating a single RC tech file involves reading a corresponding interconnect technology file 100 into field solver 120, and executing highly-complex computational programs. The process of creating capacitance table involves calculating the capacitance for the thousands or even tens of thousands of primitives having different surrounding environments. Such a process is extremely CPU-intensive, and may take from many hours to a few days to finish, depending on the computational resources and the desired accuracy. This situation has posed tremendous challenges for supporting IC design projects in advanced processing technology, where hundreds or even thousands of RC tech files are needed in a limited period of time.

SUMMARY OF THE INVENTION

These and other problems are generally solved or circumvented, and technical advantages are generally achieved by preferred embodiments of the present invention which provides a full-chip parasitic extraction method with improved accuracy.

In accordance with a preferred embodiment of the present invention, a method of extracting parasitic capacitance values from an IC layout involves first identifying a first conductor and surrounding conductive features wherein the conductive features in a first proximity of the first conductor have a first configuration. Subsequently, parasitic capacitance values between one or more edges of the first conductor and the surrounding conductive features in the first proximity are calculated by a field solver. In a similar manner, a second conductor and surrounding conductive features are identified wherein the second conductor is substantially similar to the first conductor and the conductive features in the first proximity of the second conductor have a second configuration substantially similar to the first configuration. Accordingly, parasitic capacitance values calculated from the first conductor are reused as parasitic capacitance values on the second conductor.

In accordance with another preferred embodiment of the present invention, a method of generating a technology file for use by at least one IC design tool comprises a first step of identifying conductive feature patterns of a given technology generation. Parasitic capacitance extraction on the identified patterns is subsequently performed. Capacitance models on the identified patterns are then created and characterized. A technology file needed for an IC design project can be created through assembling a plurality of the pre-developed, pre-characterized capacitance models.

In accordance with yet another preferred embodiment of the present invention, a system for generating technology file for use by at least one IC design tool comprises a user interface for creating and submitting a request of a technology file needed for an IC design project. The system also comprises a database of parasitic capacitance models that are created from a plurality of conductive feature patterns identified from a given technology generation. The system further comprises a server that is configured to receive a request from a user interface and create a technology file in response to the request through assembling a plurality of pre-developed, pre-characterized capacitance models from the database.

An advantage of a preferred embodiment of the current invention is that the preferred parasitic extraction method can significantly reduce field solver computational intensity and reduce technology file preparation cycle time through eliminating redundant computational efforts routinely performed in the prior art capacitance extraction practice.

Another advantage of a preferred embodiment of the current invention is that a needed capacitance table for designing an IC product is generated through assembling a plurality of pre-developed and pre-characterized capacitance models. This structural capacitance extraction approach offers IC foundry tremendous flexibility and cost advantage.

A further advantage of a preferred embodiment of the current invention is that the network based technology file generating system provides IC designers the means of accessing the up-to-date technology file needed for a design project in a timely manner.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the present preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely methods of generating RC tech files for the various IC design EDA tools. A common feature of the various embodiments is to replace the existing time-consuming RC tech file generation processes with ones that require significantly reduced computational intensity, while still being able to obtain capacitance tables with the desired accuracy. In one preferred embodiment, creating RC tech files for an advanced technology generation involves a significantly reduced computational intensity. Capacitance table in a created RC technology file exhibits matching extraction accuracy with those obtained through known extraction methods. In another preferred embodiment, the process of creating the capacitance table for an RC tech file is accomplished through, among other operations, "assembling" a plurality of pre-developed and pre-characterized capacitance models extracted from a plurality of conductive feature patterns, which are identified from the various technology nodes and process flows of a given technology generation. In a further embodiment, the tech file needed for an IC design project is created by an IC designer via a network-based computer system, which is linked to a pre-developed, technology foundry capacitance model database. The details of the preferred embodiments will be described below.

Figure 3:
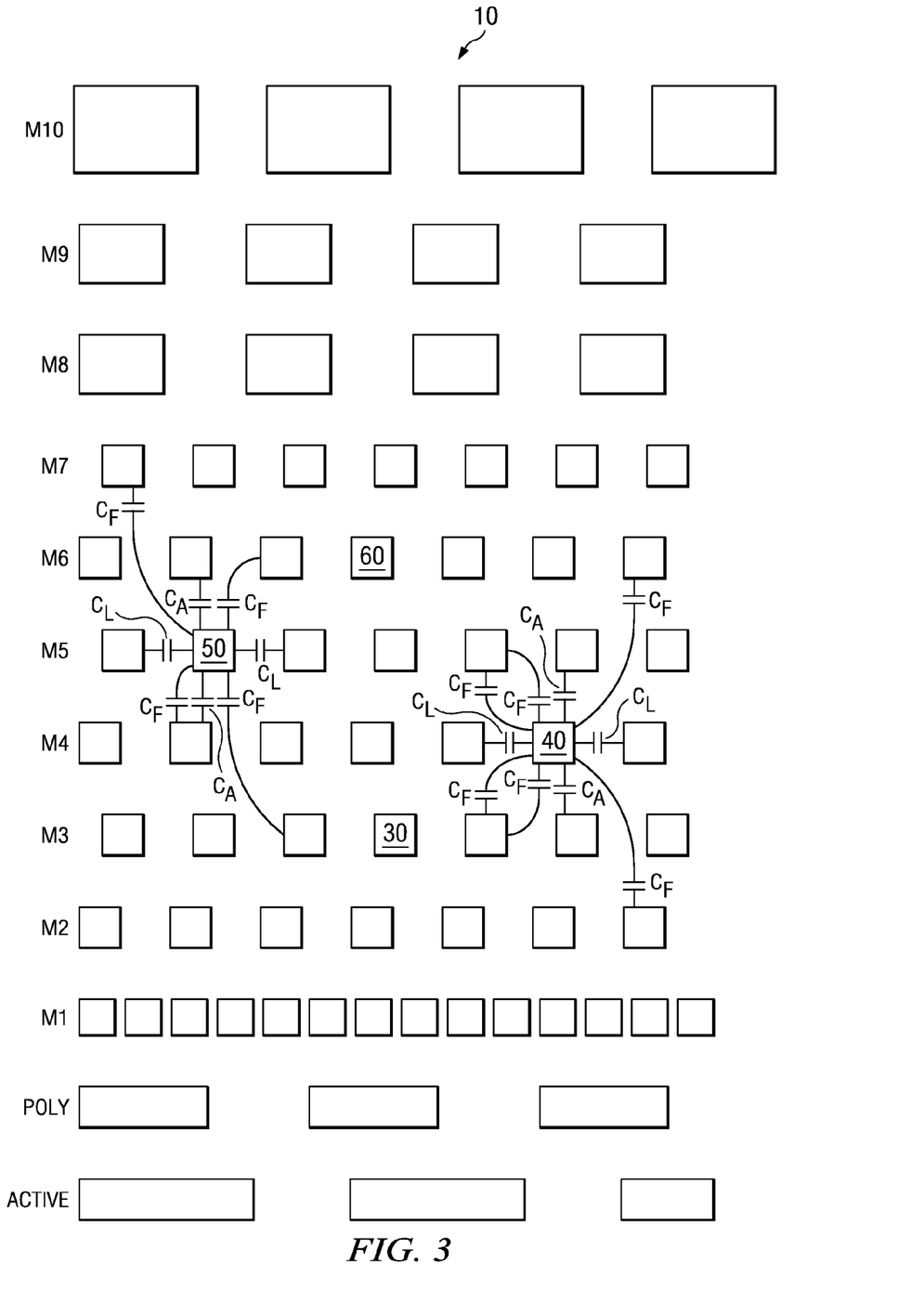
FIG. 3 is a cross sectional view of a first IC illustrating the parasitic capacitance components in an interconnect environment.

FIG. 3 is a cross sectional view of IC 10, fabricated by an ultra-deep submicron processing technology (conductor feature sizes smaller than 0.25 micron), illustrating the parasitic capacitance components in a first interconnect environment. FIG. 3 illustrates a conductive active layer formed in a substrate (not shown), a conductive polycrystalline (poly) layer, and ten interconnect layers (M1 through M10). Among the conductors in the various interconnect layers, conductors in the first interconnect layer (M1) have a first plurality process characteristics (e.g., thickness, conductivity, width, spacing) and are typically formed to make local connections between the nodes of one or more adjacent semiconductor devices (not shown), for example. Conductors in the second interconnect layer (M2) through the seventh interconnect layer (M7) have a second plurality of process characteristics, such as a greater thickness than conductors in M1, minimum design rule width and spacing. These conductors are typically used to transmit electrical signals between the various semiconductor devices located in the different regions of IC 10. Dielectric materials formed between M2 through M7 have a substantially similar dielectric constant value (k) and thickness. Conductors in the eighth interconnect layer (M8) and the ninth interconnect layer (M9) are significantly thicker and wider than conductors in the underlying interconnect layers and are typically formed to deliver electrical power to the various semiconductor devices in IC 10. Conductors in the tenth interconnect layer (M10) include input/output pads, which typically have the largest feature size and are used to apply the outside signals to and retrieve the processed results from IC 10. In a preferred embodiment, conductors in M1 through M9 are made of copper. Whereas, conductors in M10 are made of aluminum.

A method of extracting parasitic capacitances in one preferred embodiment is demonstrated through capacitance extraction on primitive conductor 40 formed in M4, and on primitive conductor 50 formed in M5. In facilitating description, primitive conductor 40 and 50 are also interchangeably referred to as conductor 40 and 50, or primitive 40 and 50, respectively, throughout the following. Capacitances extracted on primitive 40 include area capacitances $C_A$ between the top surface of primitive 40 and the bottom surface of an overlapping conductor in M5, and between the bottom surface of primitive 40 and the top surface of an underlying conductor in M3. Capacitances extracted on primitive 40 also include lateral capacitances $C_L$ between the lateral edges of primitive 40 and the adjacent lateral edges of neighboring conductors in M4. Capacitances extracted on primitive 40 further include fringing capacitances $C_F$ between the top and bottom surface of primitive 40 and the lateral edges of conductors existed in the overlaying and underlying interconnect layers, and between the lateral edges of primitive 40 and the top and bottom surfaces of conductors in the overlaying and underlying interconnect layers. In a preferred embodiment, the field solvers employed for extracting capacitances on conductor primitives of interests include SYNOPSYS Inc.'s RAPHAEL®, and MENTOR GRAPHICS Inc.'s "CALIBRE xRC"®, although other field solvers providing matching extraction performance are not excluded.

In extracting capacitances on primitives 40 and 50 in the current embodiment, two approaches are practiced. Firstly, calculation of fringing capacitances $C_F$ on primitive 40, which typically accounts for a dominating proportion of the overall computational intensity due to its extensive presence in the proximity of a primitive of interests, is performed between the top surface of primitive 40 and the adjacent lateral edges of overlying conductors in M5 and M6, and between the bottom surface of primitive 40 and the adjacent lateral edges of underlying conductors in M3 and M2. The $C_F$ calculation is also performed between the lateral edges of primitive 40 and the adjacent bottom surfaces of conductors in the overlaying M5 and M6 layers, and the adjacent top surfaces of conductors in the underlying M3 and M2 layers. It is noted, however, that $C_F$ extraction between a surface of primitive 40 and a surface of conductors more than two interconnect layers apart is not performed. It is believed that the conductors in M2, M3, M5, and M6 layers provide a significant shielding effect on the electrical field originated from primitive 40. Fringing capacitances $C_F$ between primitive 40 and conductors over the two-interconnect-layer range are negligibly small and can be safely ignored in $C_F$ extraction without creating significant impact on the extraction accuracy. As a quantitative measure, $C_F$ between primitive 40 and conductors in M1, M7, and conductors further away account for only about 3% of the overall fringing capacitance.

Secondly, the capacitances extracted on primitive 40 are "reused" as the parasitic capacitance on primitive 50. No separate capacitance extraction on primitive 50 is performed. This is because the conductive features in the two-interconnect-layer proximity of primitive 50 are substantially similar to, and indistinguishable with those in the two-interconnect-layer proximity of primitive 40, as far as the electrical field characteristics are concerned. Thus, the surrounding electrical field with respect to primitive 50 is substantially similar to that with respect to primitive 40. The influence from conductors two interconnect layers away is negligibly small and can be ignored in $C_F$ extraction, as explained with respect to primitive 40.

The validity of the above mentioned "shielding effect" and the "reuse" scheme is elaborated as the following. Highly dense conductive features in the various interconnect layers (e.g. wires having minimum design rule spacing) can be expected in an IC made by advanced technology, except in the topmost metal layers, such as M8, M9 and M10. This is because in a die area where functional circuits are popularly presented, the minimum conductor spacing rule is enforced in order to place maximum possible numbers of conductors (e.g., signal wires) in the interconnect layers. Whereas, in the die areas where functional conductors are sparse, dummy conductors (floating conductors) are filled into those unoccupied die areas, typically complying with the minimum conductor spacing rule, in order to achieve homogenous conductor distribution on the substrate surface. This practice prevents processing yield loss during the various manufacturing processes, such as chemical-mechanical polishing (CMP) process and dry etching process, and is widely used and well known to those skilled in the art.

After adopting the above mentioned approaches in capacitance extraction, the running time of the field solver for creating a tech file for a given process flow of a given technology node is significantly reduced, from about three-days/ten-CPUs to about four-hours/two-CPUs in the current embodiment.

Remaining in FIG. 3, in an additional and/or alternative embodiment, a low-k dielectric material is used as an interlayer planer dielectric to isolate one interconnect layer from another in IC 10. $C_F$ extraction on primitive 40 is performed between a surface of primitive 40 and a surface of adjacent conductors in M3 and M5. Fringing capacitances $C_F$ between primitive 40 and conductors over the one interconnect layer range, such as conductors in M2 and M6, are negligibly small and, thus, ignored. This is because a low-k interlayer planer dielectric material substantially reduces coupling capacitance between conductors in adjacent interconnect layers. In the current embodiment, the capacitances extracted on primitive 40 are reused on primitives 30, 50, and 60, which have substantially similar surrounding conductive features as that of primitive 40, as can be appreciated.

Figure 4:
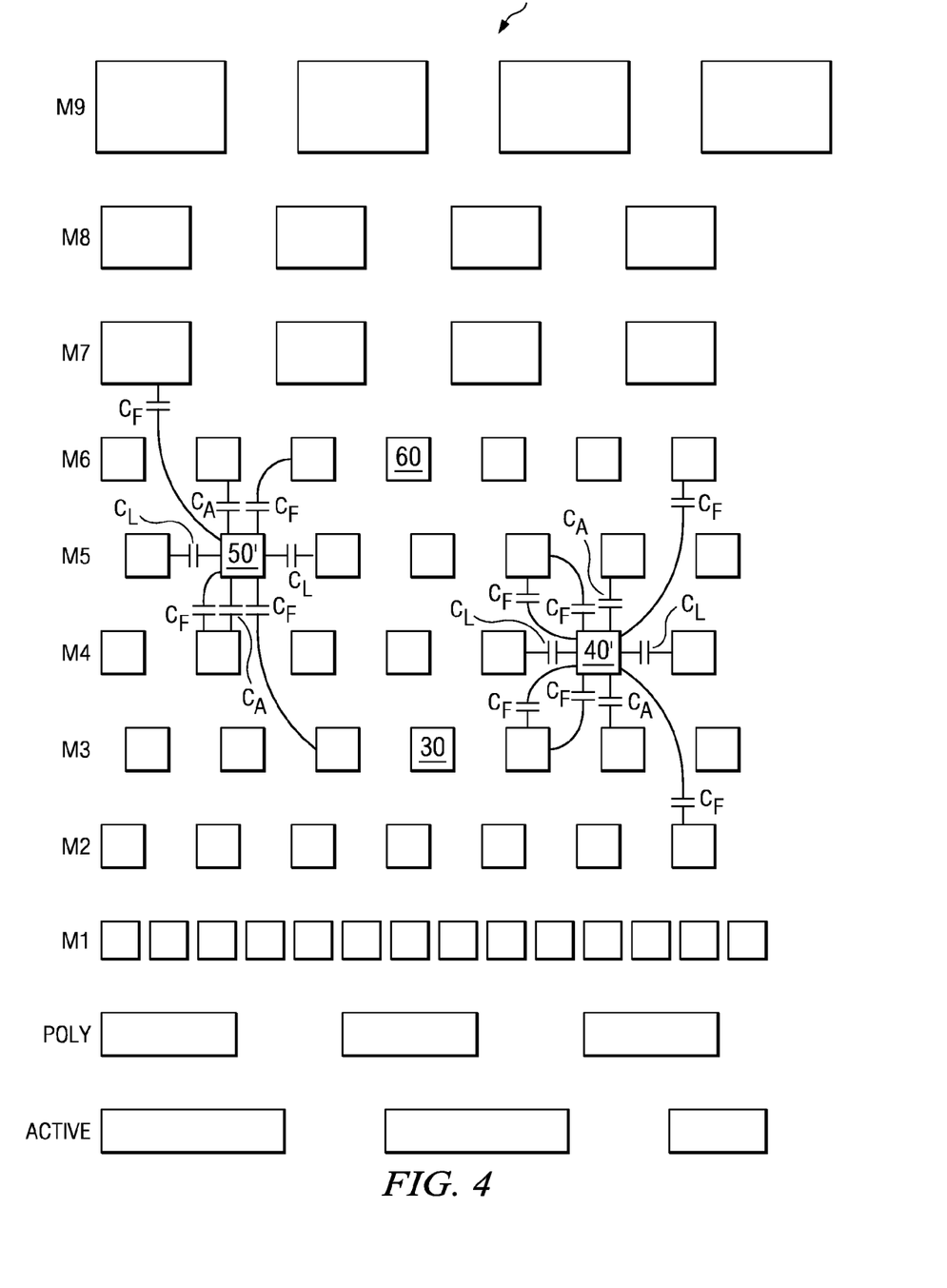
FIG. 4 is a cross sectional view of a second IC illustrating the parasitic capacitance components in an interconnect environment.

FIG. 4 shows the cross sectional view of IC 20 used in a further additional and/or alternative embodiment. IC 20 is formed by the same technology node used in fabricating IC 10, except that conductors used to transmit electrical signals are formed in M2 through M6. The topmost M7, M8, M9 conductors have greater thickness and width, and are used to form power tracks and I/O pads, for example. In extracting capacitance on primitive 40' in M4, capacitance extracted from primitive 40 of IC 10 in FIG. 3 is "reused." No separate capacitance calculation on primitive 40' is performed. This is valid because primitive 40' and 40 have a substantially similar surrounding electrical field within the two interconnect layer range, thus having a substantially similar capacitance. As an even further and/or alternative approach of "reuse," capacitance table of IC 20 is formed by "deleting" the capacitances associated with conductors in M4 from the capacitance table created for IC 10 of FIG. 3. This is valid because such an operation does not alter the conductive feature environments of the various conductors in IC 20 of FIG. 4, thus will not sacrifice extraction accuracy through the current "reuse" approach. In contrast, for the purpose of explanation, significant error would be introduced for an attempt to "deleting" the capacitances associated with conductors in M5 from the capacitance table created for IC 10 of FIG. 3, because M5 conductors, such as M5 conductor 50,' in IC 20 of FIG. 4 have significantly different conductive feature environments considering the large M7 conductor features in IC 20 of FIG. 4.

In another aspect of the current invention, tech files, and more specifically, capacitance tables in correspondence with a certain technology generation are created through a structured approach. As described previously in regarding to a known approach, the process of interconnect technology file preparation and field solver operation is independently performed for each and every tech file targeting a given technology node and process flow of a given technology generation. In contrast, a structured approach in one preferred embodiment first identifies the common patterns of conductive features in a given technology generation. Capacitances on an identified pattern are subsequently extracted and capacitance model is created and characterized. A capacitance table, and thus tech file in correspondence with a given technology node and process flow is generated through "assembling" the various capacitances models created through the pre-identified patterns. The structural approach used in preferred embodiments significantly reduces the cycle time and computational intensity required in developing tech files for a given technology generation. The details of a structural approach are described via the technology generation used in forming IC 10 with respect to FIG. 2 as described in the following.

Figure 5:
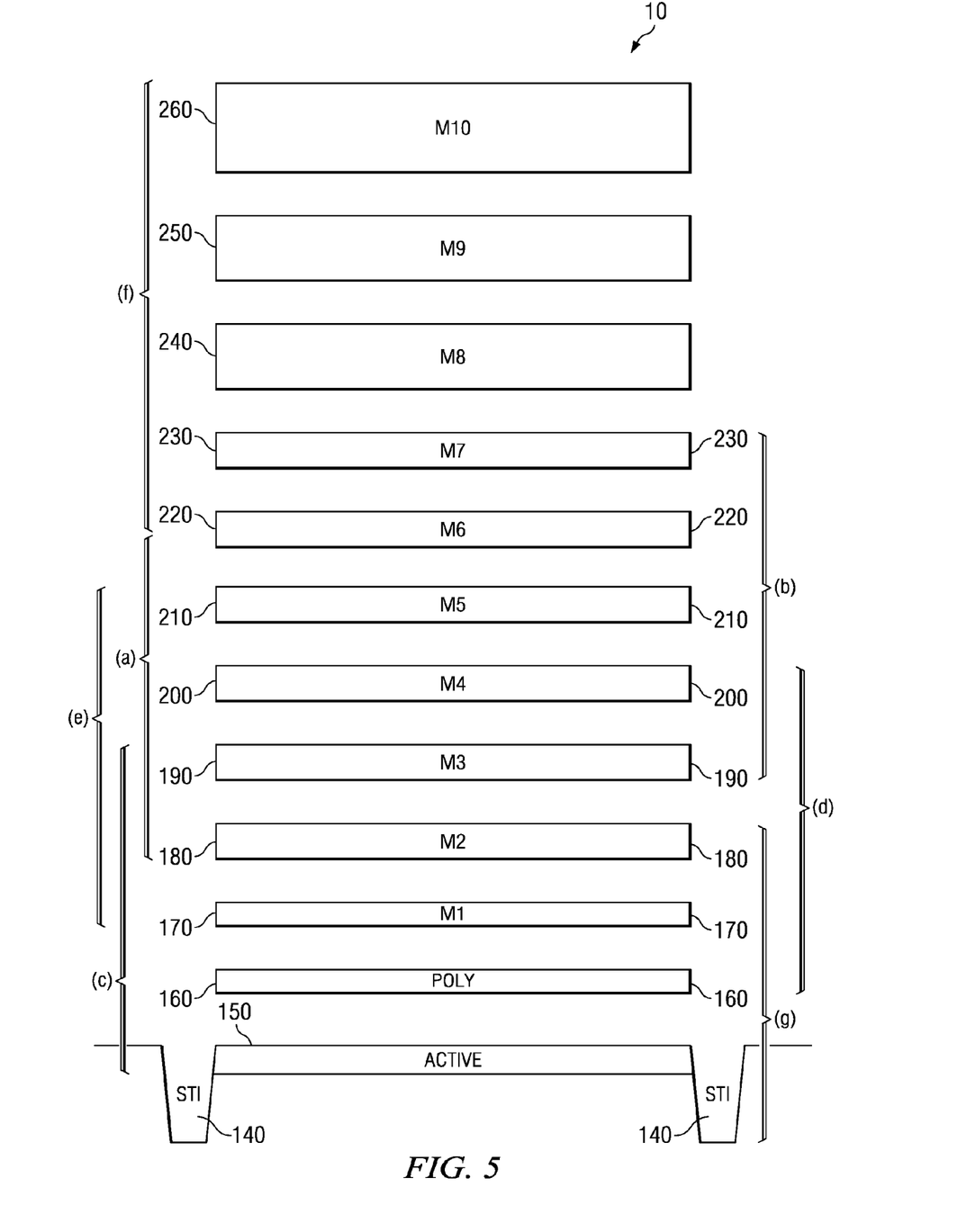
FIG. 5 is a cross sectional of the first IC illustrating the process of identifying common conductive feature patterns in a given technology generation.

FIG. 5 is a cross sectional view illustrating a second interconnect environment in IC 10 of FIG. 3. It includes an active layer, a poly layer, and sheet conductors formed in the ten interconnect layers. The process characteristics of the various metal layers have been described above with respect to FIG. 3 and will not be herein repeated. First metal layer cluster (a) in FIG. 5 includes primitive of interest 200 formed between two overlying conductors 210 and 220 in M5 and M6, and two underlying conductors 180 and 190 in M2 and M3. The five conductors have identical dimension and process characteristics (e.g., thickness, conductivity, dielectric thickness). Second metal layer cluster (b) in FIG. 5 includes primitive of interest 210 formed between two overlying conductors 220 and 230 in M6 and M7, and two underlying conductors 190 and 200 in M3 and M4. It can be recognized that cluster (a) and cluster (b) comprise the same number of conductors having identical process characteristics. Capacitances extracted from primitive 200 of cluster (a) are substantially similar with the capacitances extracted from primitive 210 of cluster (b). It is also observed that similar clusters are popularly presented in other ICs made by the same technology generation. As a result, cluster (a), cluster (b) and other similar clusters are identified as a unique pattern among the various conductive environments of the current technology generation. Subsequently, the process characteristics of the identified pattern are separately described in an interconnect technology file and capacitances are extracted using a preferred field solver described earlier. The extraction process is repeated on all identified patterns of a given technology generation.

Figure 6:
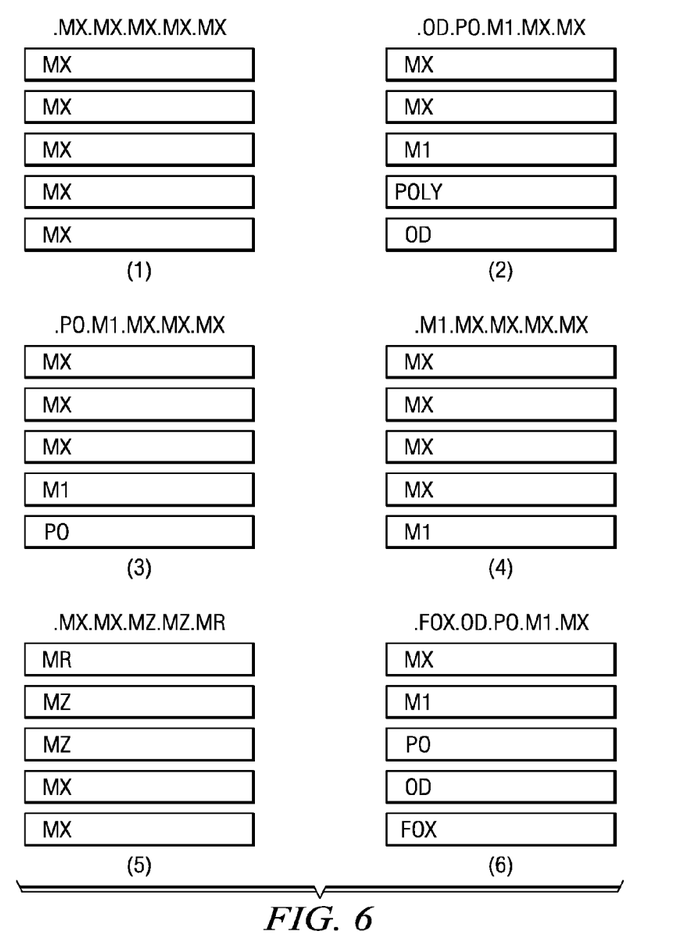
FIG. 6 shows a few patterns identified from the various conductive feature clusters in a given technology generation.

FIG. 6 shows multiple patterns identified from the various conductive feature clusters in the current technology generation. Pattern (1) is identified from clusters (a) and (b) in FIG. 5, and other similar clusters in other ICs, and comprises five sheet metal layers formed in five consecutive interconnect layers used for signal transmitting in an IC. The extracted capacitance of pattern (1) is saved in a parasitic database (not shown) with an identifier ".MX.MX.MX.MX.MX," which indicates that the pattern is composed of five metal layers "M" and each metal layer has an identical process characteristics (e.g., thickness, conductivity, dielectric layer thickness, metal-to-metal spacing) of "X," such as those of M2 through M7 of IC 10 with respect to FIG. 3 and FIG. 5.

Similarly, pattern (2) is identified from cluster (c) in FIG. 5 and similar clusters in other ICs, which includes M1 sheet conductor 170 formed between overlying conductors 180 and 190 having substantially similar dimension formed in M2 and M3, and underlying conductors 150 and 160 having a substantially similar dimension formed in the poly and active layers. The extracted capacitance model is saved as ".OD.PO.M1.MX.MX," which indicates that the pattern is composed of an active layer (OD), poly layer (PO), M1 layer, and two MX layers. It is noted that, in current technology generation, M1 has different process characteristics (e.g., thinner that other metal layers) from M2 through M7, thus is separately identified.

In a similar manner, pattern (3) is identified from cluster (d) in FIG. 5 and similar clusters in other ICs, which leads to a capacitance model of ".PO.M1.MX.MX.MX." Pattern (4) is identified from cluster (e) in FIG. 5 and similar clusters in other ICs, which results in a capacitance model of ".M1.MX.MX.MX.MX." Pattern (5) is identified from cluster (f) in FIG. 5 having a capacitance model of ".MX.MX.MZ.MZ.MR," where "MZ" and "MR" identify the process characteristics of M8 conductor 240, M9 conductor 250 and M10 conductor 260, respectively. Additional exemplary patterns shown in FIG. 6 include pattern (6) identified from cluster (g) in FIG. 5 leading to a capacitance model of ".FOX.OD.PO.M1.MX," where "FOX" identifies the process characteristics (e.g., profile) of field isolation region STI.

Figure 7:
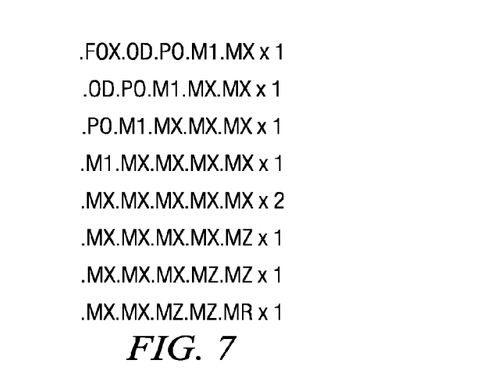
FIG. 7 shows an example of generating a capacitance table using pre-characterized capacitance models.

In the current embodiment, 28 patterns are identified and corresponding capacitance models are created for a given interconnect environment. Hundreds of capacitance models are created for a plurality of interconnect environments of interests. As can be appreciated, capacitance tables in correspondence with the various technology nodes and process flows of a given technology generation can be readily generated by "assembling" the pre-characterized capacitance models through a proper manner. As an example, FIG. 7 shows how pre-characterized models are used to generate capacitance table of the interconnect configuration of IC 10 illustrated with respect to of FIG. 5. From top to bottom, the pre-characterized models are used to extract the capacitances from primitive 160 through primitive 240, respectively. Model ".MX.MX.MX.MX.MX" are used twice for primitives 200 and 210, which are located in substantially similar electrical environment, as understood.

In an additional and/or alternative embodiment, a technology file created through the aforementioned method for a first process flow of a given technology node is used to generating a technology file generated for a second process flow of a given technology node by removing or adding one or more pre-developed, pre-characterized capacitance model into the created technology file. Through a similar manner, a technology file generated for a first technology node is used to generate a technology file for a second technology node in a further addition and/or alternative embodiment.

In an additional and/or alternative embodiment, capacitance models as described above are developed in a three-conductor layer configuration, where a primitive of interest is sandwiched between an underlying conductor and an overlying conductor. Furthermore, the examples described above are solely utilized to demonstrate the inventive idea of structural capacitance extraction approach. This approach may be used to extract capacitances on any technology nodes and process flows having various configurations, so long as repetitive conductive feature patterns are identified for a given technology generation.

With the advent of the structural technology file generating approach, as described above, an IC foundry tech file development team has redirected its previous efforts of creating a separate tech file for each technology node and process flow of a given technology generation to an effort of creating capacitance models for the identified conductive feature patterns in a given technology generation. A request for tech files from an IC designer (customer or user) can be filled in a timely manner through "assembling" the pre-developed and pre-characterized capacitance models. Thus, an IC foundry is offered tremendous flexibility and cost advantage in providing the required tech files for the various IC design projects using different technology nodes and process flows. This feature is elaborated through an exemplary tech file generation system, as described in the following.

Figure 8:
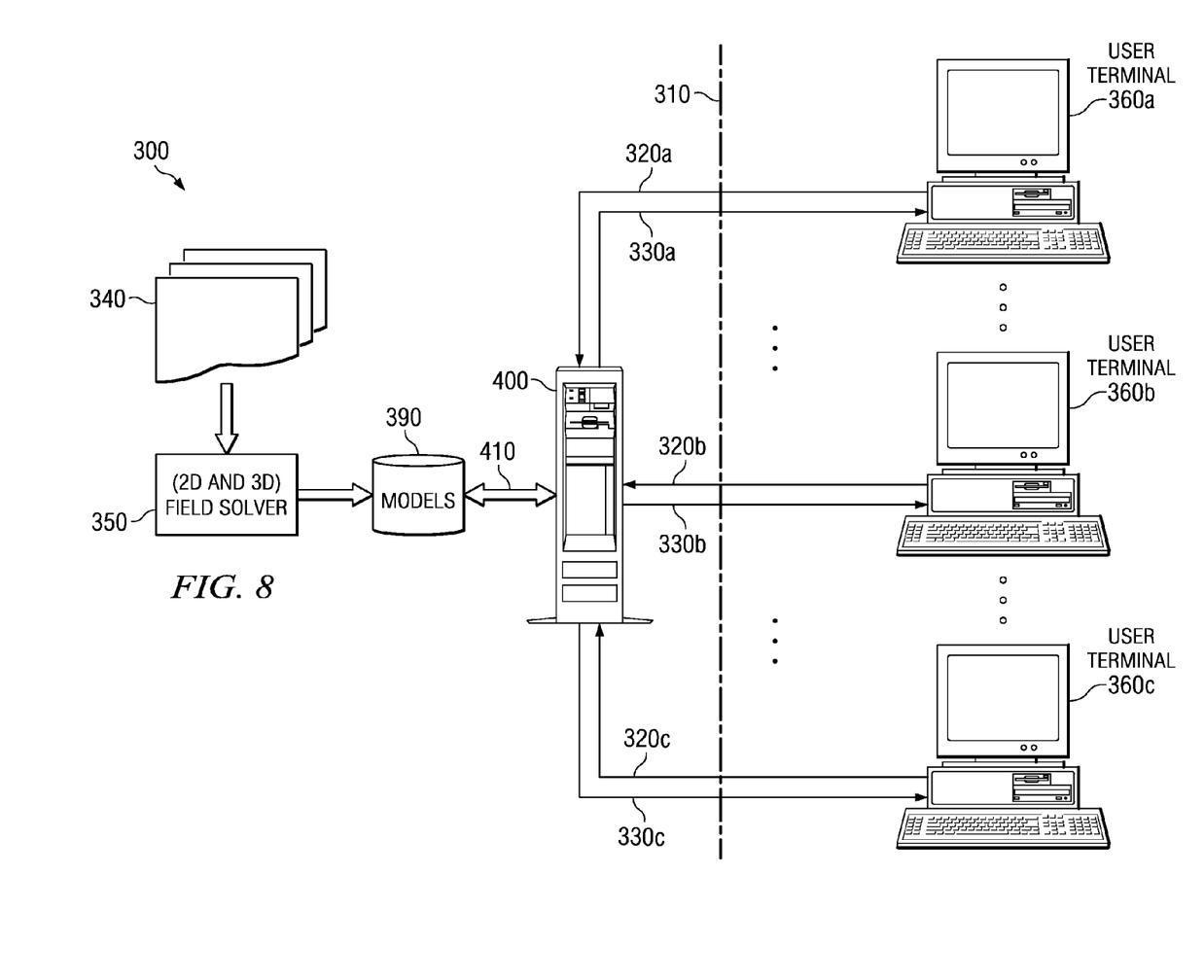
FIG. 8 illustrates a system diagram of a network-based technology file generating system in a preferred embodiment.

FIG. 8 is a flow diagram of technology file generation system 300 used in an additional preferred embodiment of the current invention. System 300 is a network-based, multi-user and multi-task computer system. System 300 includes database 390 where pre-developed and pre-characterized capacitance models of the identified capacitance patterns in correspondence with various technology generations are stored. The process of creating capacitance models of the identified capacitance patterns of a given technology generation includes preparing interconnect technology file 340 for each identified pattern and executing field solver 350 for each interconnect technology file 340. The detail of the capacitance model generating process has been described previously and will not be repeated herein. System 300 also includes technology file generation engine 400, which is illustrated as a multi-user and multi-task software program installed in a server in the presently described embodiment. In the current preferred embodiment, engine 400 includes executables files running on an UNIX platform. Engine 400 is configured to read tech file requests (e.g., 320a, 320b and 320c) via user interface 310 from different users (e.g., 360a, 360b, and 360c) typically in remote locations. Engine 400 subsequently fetches 410 desired, pre-developed and pre-characterized capacitance models stored in database 390, and automatically synthesizes and returns the synthesized technology files (e.g., 330a, 330b, and 330c) to the various users. System 300 can be implemented on, but not limited to, an intra-net, private network, and world-wide-web. System 300 allows users of various IC design projects to obtain desired tech files in a timely manner.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of generating a technology file for use by at least one IC design tool, the method comprising:
   identifying a unique pattern of conductive features from a plurality of conductive features of a given technology generation;
   after identifying the unique pattern of conductive features, extracting a parasitic capacitance of said unique pattern of conductive features from said unique pattern of conductive features;
   creating a capacitance model of said unique pattern of conductive features based on the parasitic capacitance of said unique pattern of conductive features;
   identifying a corresponding pattern of conductive features from the plurality of conductive features, the corresponding pattern of conductive features corresponding to the unique pattern of conductive features; and
   using a processor unit, generating a first technology file comprising a first plurality of said capacitance model of said unique pattern of conductive features, wherein said first plurality is formed by replicating said capacitance model of said unique pattern of conductive features for the corresponding pattern of conductive features.

2. The method of claim 1, wherein said technology generation is an ultra-deep submicron processing technology having conductive feature sizes smaller than 0.25 micron.

3. The method of claim 1, wherein said unique pattern of conductive features comprises a conductor of interest sandwiched between a first and second conductive features in first and second overlying interconnect layers, and third and fourth conductive features in a third and fourth underlying interconnect layers, respectively.

4. The method of claim 1, wherein said extracting said parasitic capacitance is performed by a field solver having a three-dimensional accuracy.

5. The method of claim 1, wherein said capacitance model is identified by a feature identifier specifying a conductive feature process characteristic.

6. The method of claim 1, further comprising: saving said capacitance model in a parasitic capacitance model database.

7. The method of claim 1, further comprising: generating a second technology file from said first technology file by removing or adding at least one of said capacitance model.

8. The method of claim 1, wherein the identifying the unique pattern of conductive features from the plurality of conductive features comprises identifying conductive features based on a parameter in relation to one of the conductive features of the unique pattern of conductive features.

9. The method of claim 8, wherein the parameter in relation to the one of the conductive features comprises excluding conductive features more than two interconnect layers from te one of the conductive features.

10. A system for generating a technology file for use by at least one IC design tool, the system comprising:
a user interface to receive input to create and submit a request, wherein said request specifies a technology file;
an extraction tool to determine parasitic capacitance models, said extraction tool, for each of said parasitic capacitance models, to identify a unique pattern of conductive features from a plurality of conductive features identified from a given technology generation, said extraction tool to extract a parasitic capacitance model based on each of said conductive features of said unique pattern of conductive features after identifying said unique pattern of conductive features;
a database to store said parasitic capacitance models; and
a server configured to receive said request from said user interface, said server being remote from and communicatively coupled with said user interface, said server configured to create said technology file in response to said request through identifying a corresponding pattern of conductive features corresponding to said unique pattern of conductive features of at least one of said parasitic capacitance models and replicating said at least one of said parasitic capacitance models from said database for said corresponding pattern of conductive features.

11. The system of claim 10, wherein said system is a networked based system wherein said database is provided by an integrated circuit foundry and said user interface is provided to a user computer terminal.

12. The system of claim 10, wherein said server comprises an executable technology file generating software program.

13. The system of claim 12, wherein said software program runs on a UNIX platform.

14. The system of claim 10, wherein said unique pattern of conductive features comprises a conductor of interest sandwiched between first and second conductive features in first and second overlying interconnect layers in an integrated circuit, and third and fourth conductive features in third and fourth underlying interconnect layers in said integrated circuit.

15. The system of claim 10, wherein the extraction tool comprises a field solver configured to read an interconnect technology file specifying a process characteristic of said unique pattern of conductive features and to create said parasitic capacitance models.

16. The system of claim 15, wherein said field solver has a three-dimensional accuracy.

* * * * *

UNITED STATES PATENT AND TRADEMARK OFFICE
CERTIFICATE OF CORRECTION

PATENT NO. : 8,826,207 B2  
APPLICATION NO. : 11/966570  
DATED : September 2, 2014  
INVENTOR(S) : Hou et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1324 days.

Signed and Sealed this
Eighteenth Day of August, 2015

Michelle K. Lee
*Director of the United States Patent and Trademark Office*